United States Patent [19]

Oian et al.

[11] Patent Number: 5,353,233
[45] Date of Patent: Oct. 4, 1994

[54] METHOD AND APPARATUS FOR TIME VARYING SPECTRUM ANALYSIS

[75] Inventors: Shie Oian; Dapang Chen, both of Austin, Tex.

[73] Assignee: National Instruments, Inc., Austin, Tex.

[21] Appl. No.: 851,725

[22] Filed: Mar. 17, 1992

[51] Int. Cl.$^5$ .................. G06F 15/31; G01R 23/16
[52] U.S. Cl. .................. 364/485; 364/725
[58] Field of Search ............ 364/484, 485, 826, 725; 342/192, 194, 195; 73/602

[56] References Cited

U.S. PATENT DOCUMENTS

| | | | |
|---|---|---|---|
| 4,837,578 | 6/1989 | Gammell | 73/602 |
| 4,894,795 | 1/1990 | Whitehouse et al. | 364/807 |
| 5,046,504 | 9/1991 | Albert et al. | 128/696 |
| 5,291,560 | 3/1994 | Daugman | 382/2 |

OTHER PUBLICATIONS

D. Gabor, "Theory of Communication", J.IEE (London), vol. 93, No. 111, Nov. 1946, pp. 429–457.

Qian, et al., "On Wigner Distribution Decomposition", Electrical Engineering Dept., University of Maryland, supported by ONR Grant #N00014-89-J1210, Feb. 1991.

Qian, et al., "Wigner Distribution Decomposition and Cross-term Interference Cancellation", UMBC Technical Report No. EER-91-1, University of Maryland, Jan. 1991.

Wexler, et al., "Discrete Gabor Expansions", Signal Processing, vol. 21, No. 3, Nov. 1990, pp. 207–221.

Primary Examiner—Thomas G. Black
Assistant Examiner—Michael Zanelli
Attorney, Agent, or Firm—Gambrell, Wilson & Hamilton

[57] ABSTRACT

A signal analyzer generates a time varying spectrum for input signals characterized by frequency components which change in time. The signal analyzer includes a converter generating a sequence of digital signals representative of an input signal. The sequence of digital signals is supplied to a digital signal processor which computes orthogonal-like discrete Gabor transform coefficients $C_{m,n}$ in response to the sequence, and a time varying spectrum of the input signal energy in response to the coefficients. Finally, a data processor processes the spectrum for further analysis or display. One particular analysis step for which the time varying spectrum is useful is in partitioning the input signal into separate components. The orthogonal-like discrete Gabor transform coefficients are computed using a non-periodic, localized discrete window function h and a discrete auxiliary function γ, similar to h. The time varying spectrum is computed utilizing a cross-term deleted Wigner-Ville distribution.

48 Claims, 9 Drawing Sheets

FIG.−5

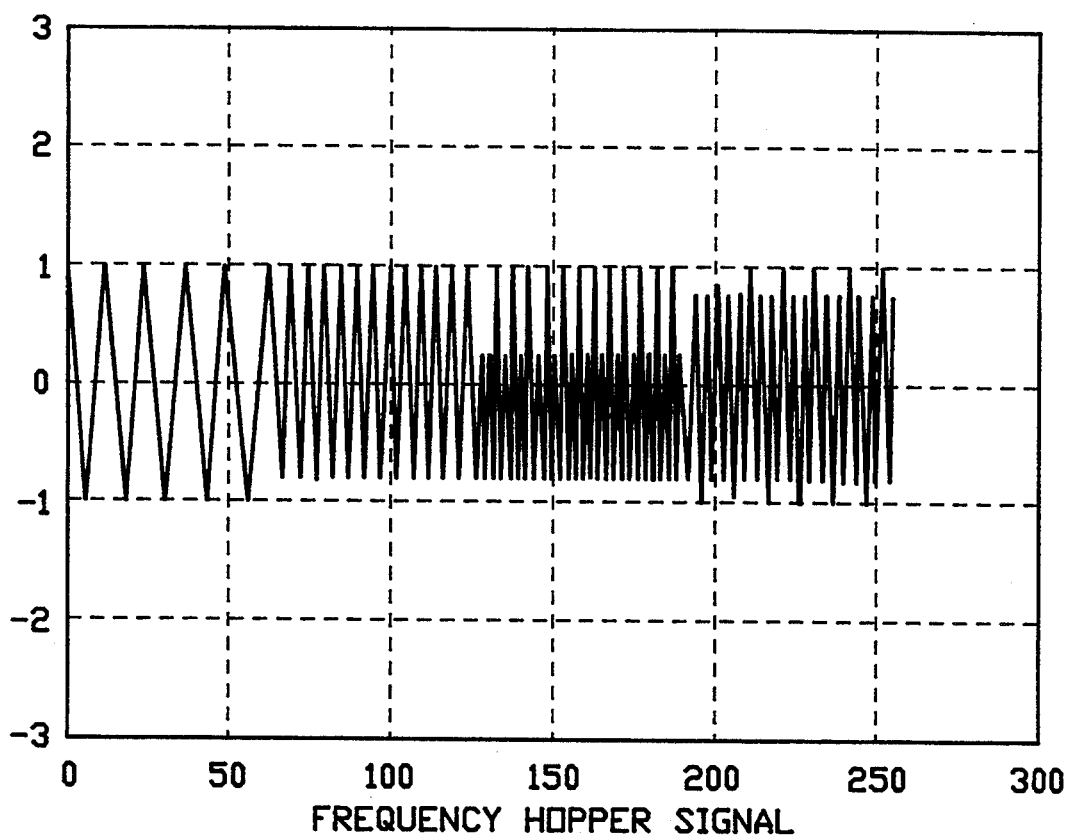
FIG.—7A
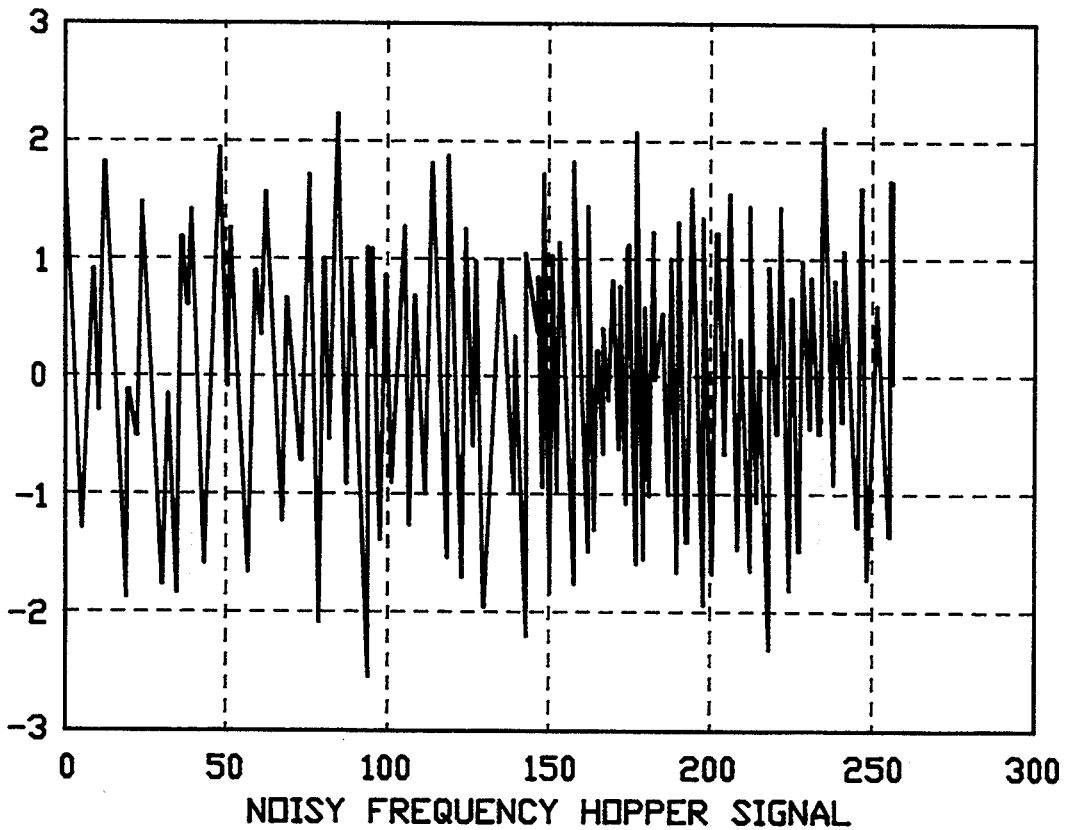
FIG.—7B

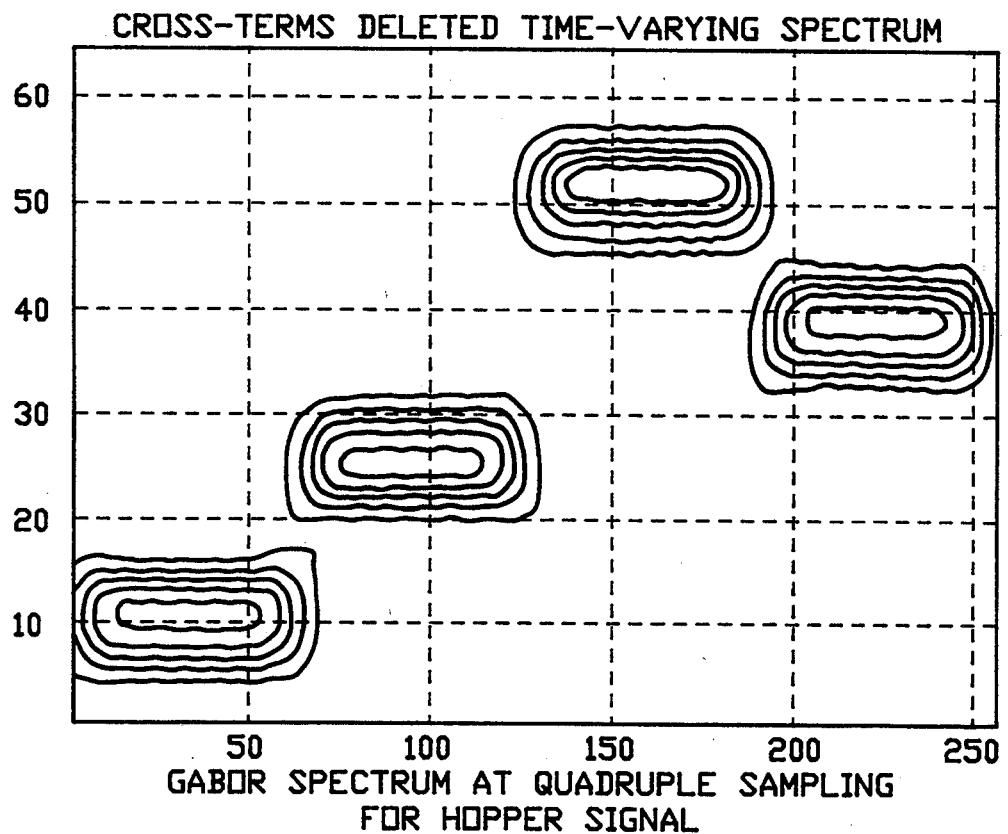
FIG.—8A
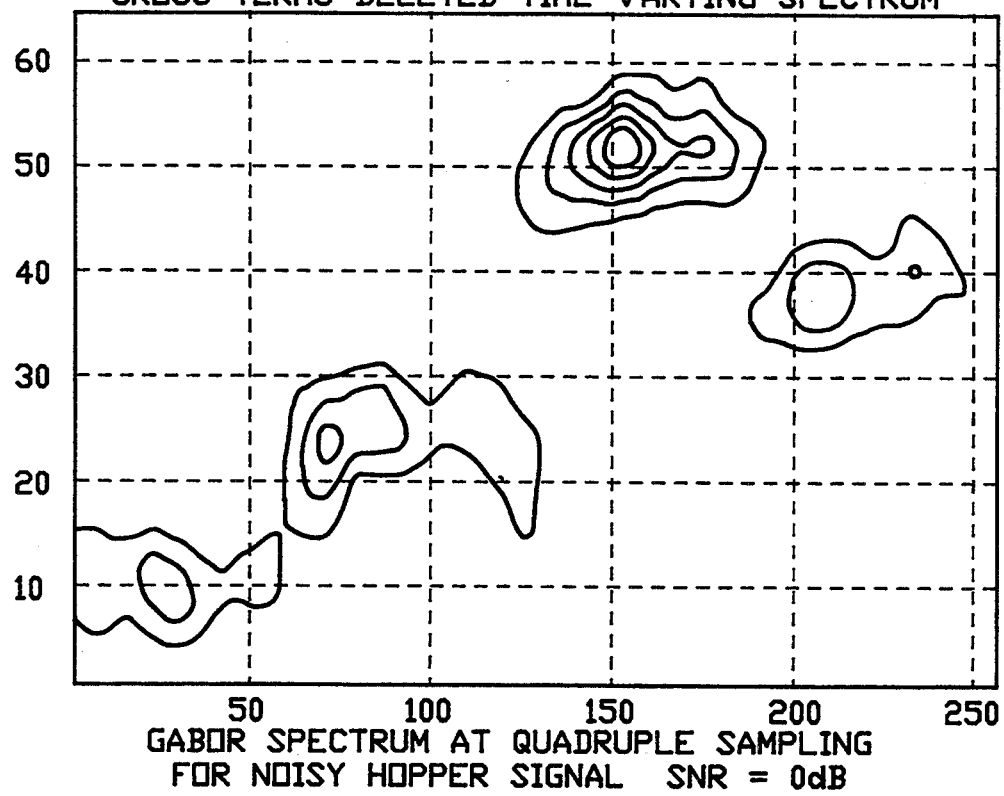
FIG.—8B

METHOD AND APPARATUS FOR TIME VARYING SPECTRUM ANALYSIS

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

BACKGROUND OF THE INVENTION

1. Field of the Invention

The present invention relates to digital signal processing; and more particularly, to machines and methods for determining characteristics of signals having frequency components that vary in time.

2. Description of the Related Art

Typical systems for digital signal processing involve conversion of an input analog signal to a sequence of digital samples, supplying blocks of the digital samples in the sequence to a digital signal processing engine which performs array or block level computations on the digital signals, and analyzing the results of the computations. This field is rapidly expanding in the areas of speech processing, image recognition for radar and sonar, underwater acoustics, and other technologies.

The discrete Fourier transform DFT and fast Fourier transform FFT implementation of the DFT, are fundamental processing techniques in digital signal processing systems. These techniques suffer the limitation that they do not characterize signals being processed in terms of how frequency components vary in time very well.

Prior art systems for analyzing signals with frequency components that vary in time have used the so-called short time Fourier transform STFT. This algorithm is based on a computationally intensive Fourier transform of a large number of short windows of the input signal. Transforms of each of the short time windows are combined to generate a time varying spectrum of the input signal. However, time varying spectra generated using the STFT technique do not have very good resolution. Also, the STFT technique is computationally expensive.

The Gabor transform is another digital signal processing tool which generates a joint time-frequency representation of a signal. See, D. Gabor, "Theory of Communication", J.IEE (London), Vol. 93, No. III, November, 1946, pp. 429–457. Its applications, however, have been limited primarily due to the difficulty of selecting the biorthogonal auxiliary window function $\gamma$. Recently, a framework for designing the auxiliary function $\gamma$ for the finite and cyclic discrete Gabor transform has been developed. See, Wexler, et al., "Discrete Gabor Expansions", *Signal Processing*, Vol. 21, No. 3, November, 1990, pp. 207–221. In many signal processing applications, however, the finite, cyclic Gabor transform is not adequate. The lack of a general solution for the infinite discrete Gabor transform has limited the usefulness of this digital processing technique, and it has not been applied successfully to creating time-varying energy spectra. See, Qian, et al., "Wigner Distribution Decomposition and Cross-Term Interference Cancellation", UMBC Technical Report No. EER-91-1, University of Maryland, January, 1991.

SUMMARY OF THE INVENTION

The present invention provides a signal analyzer for generating a time varying spectrum for input signals characterized by frequency components which change in time. The invention can also be characterized as a method for analyzing a signal based on the time varying spectrum.

Thus, according to a first aspect, the present invention comprises a signal analyzer which includes a converter generating a sequence of digital signals representative of an input signal. The sequence of digital signals is supplied to a first processor which computes orthogonal-like discrete Gabor transform coefficients $C_{m,n}$ in response to the sequence, and a time varying spectrum, termed herein the Gabor spectrum, of the input signal energy in response to the coefficients. Finally, a second processor processes the spectrum for further analysis or display. One particular analysis step for which the time varying spectrum is useful is in partitioning the input signal into separate components. The separate components may then be individually analyzed using any of a variety of techniques.

The first processor includes an input buffer which receives the incoming sequence of digital signals, and supplies those signals in a format appropriate for computation of the coefficients in response to a buffer controller. Similarly, the processor includes an output buffer, which stores a matrix of values representative of the time varying spectrum, in coordination with the processor engine.

The digital signal processor is programmed to compute the coefficients and the time varying spectrum either by a hardware implementation, or software control of a generic processor. The routine is based on the following steps:

- acquiring a sequence of digital signals representative of the input signal;
- sampling the sequence of digital signals to define a plurality of windows of length L, each window in the plurality including a plurality of digital signals and shifted by length $\Delta M$ digital signals relative to an adjacent window;
- computing orthogonal-like discrete Gabor transform coefficients $C_{m,n}$ in sampling intervals $\Delta N$ and $\Delta M$, for n=0 through N-1 for each window m, and for the plurality of windows m=0 through M-1, such that $\Delta N \Delta M$ is less than L;
- computing the time-varying spectrum of energy of the input signal in response to the coefficients $C_{m,n}$; and
- analyzing the input signal in response to the time-varying spectrum.

The orthogonal-like discrete Gabor transform coefficients are computed using a non-periodic, localized discrete window function h, and a discrete auxiliary function $\gamma$, similar to h. The time varying spectrum is computed utilizing a cross-term deleted Wigner-Ville distribution.

According to yet another aspect of the present invention, the discrete window function h is a gaussian function having a variance $\sigma^2$ less than or equal to about $0.5(L/12)^2$, where L is a window length used in the computations.

In yet another aspect of the invention, the spectrum is computed utilizing a look-up table of pre-computed factors used in an energy distribution function based on the coefficients. For each coefficient, an update region around the coefficient on the spectrum is determined in response to the magnitude of the coefficient. The energy distribution is then computed within the update regions for each coefficient. The lookup table of pre-computed factors is calculated having a size sufficient to cover the update region of the coefficient having the maximum magnitude. In this way, a look-up table of determinant size can be utilized with a given Gabor spectrum engine.

The signal analyzer and method according to the present invention are particularly useful for signals characterized by frequency components which change in time, such as encountered in speech processing, acoustic or electromagnetic communications, acoustic or electromagnetic surveillance, radar, sonar, and a variety of other signal processing environments. For instance, the ability to identify the beginning and ending in time of a signal having a certain frequency spectrum, among a complex group of signals, such as might be encountered when a specific person begins speaking in a room with other persons present, is greatly improved by the Gabor spectrum signal analyzer and method provided by the present invention.

Other aspects and advantages of the present invention can be seen upon review of the figures, the detailed description, and the claims which follow.

BRIEF DESCRIPTION OF THE DRAWINGS

FIGS. 7A and 7B are graphs of a frequency hopper signal and a noisy hopper signal, respectively, representative of an input signal having frequency components which vary in time.

FIGS. 8A and 8B are graphs of the Gabor spectrum generated in one application of the present invention from the input signals of FIGS. 7A and 7B, respectively.

DESCRIPTION OF THE PREFERRED EMBODIMENTS

A detailed description of preferred implementations of the present invention is provided with respect to the figures.

Figure 1:
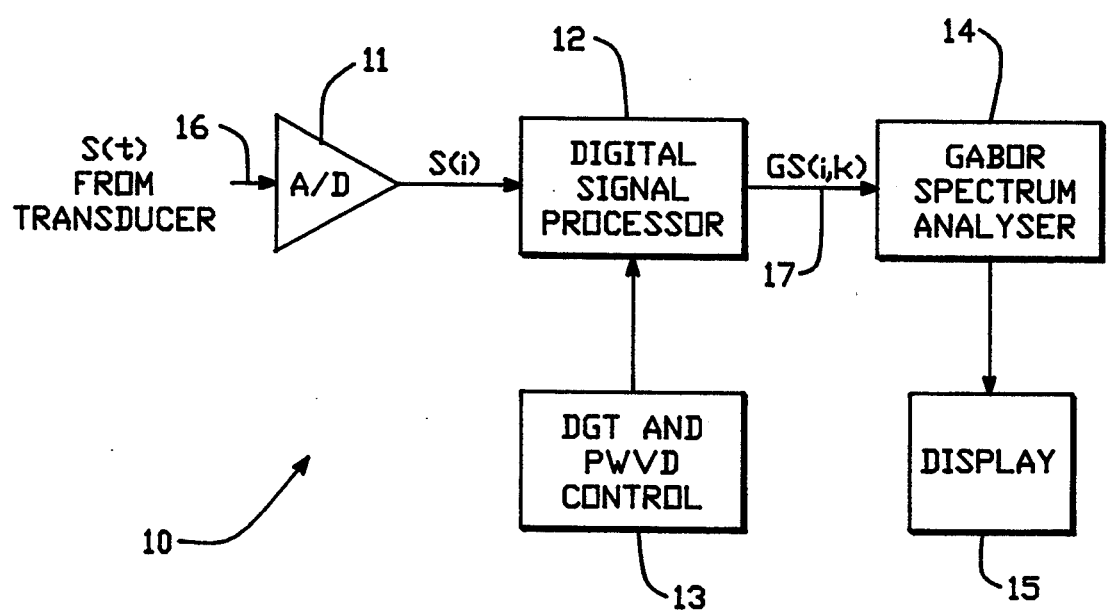
FIG. 1 is a schematic block diagram of a signal analyzer according to the present invention.

In FIG. 1, a heuristic block diagram of a signal analyzer according to the present invention is provided. The analyzer, generally referred to by the reference number 10, includes an analog to digital converter 11, a digital signal processor 12, a control module 13 coupled to the digital signal processor, a Gabor spectrum analyzer 14, and a display system 15. An input s(t) is supplied from a transducer or other source on line 16. The analog to digital converter 11 generates a sequence of digital values s(i) representative of the input signal s(t). A sequence s(i) is supplied to the digital signal processor 12. The digital signal processor may be implemented using a general purpose computer programmed to perform the DSP functions, or a special DSP engine adapted for this purpose. The digital signal processor 12 performs a discrete Gabor transformation DGT to compute the Gabor coefficients for the input signal s(i), and computes an energy distribution in time and frequency based on a cross-term deleted Wigner-Ville distribution PWDV in response to the coefficients. The energy distribution GS(i,k) is supplied at the output of the digital signal processor 12 on line 17. The energy distribution GS(i,k) is analyzed in a Gabor spectrum analyzer 14 to generate a graphic representation of the energy distribution for supply to the display 15. Also, the Gabor spectrum analyzer 14 may perform other analysis functions, such as partitioning the input signal into components in time for use in speech processing, communications, image recognition, or other purposes. The spectrum analyzer 14 may be a programmed general purpose computer, or a specialized system designed for this purpose. The analyzer 14 may be implemented on the same processor as the digital signal processor 12.

The control block 13, in one preferred embodiment, comprises a computer program, such as provided in Appendix A.

The program shown in Appendix A is one example of a source code routine written for LABVIEW (trademark of National Instruments, Inc.) instrumentation software system. Obviously a wide variety of other source code implementations could be utilized.

Appendix A consists of three routines including GaborSpectrum.c, GaborMagnitude.c, and autoWV.c. The GaborSpectrum.c sets up the data for the computation of the Gabor coefficients. The user is able to initialize the routine by selecting parameters such as the oversampling rate, the variance, and the window length for computing the spectrum. More details concerning these parameters is described below. The GaborSpectrum.c routine calls the GaborMagnitude.c routine which calculates the complex Gabor coefficients and supplies as outputs the magnitude of the coefficients for use in computing the Gabor spectrum. The routine autoWV.c calculates the energy distribution in response to the coefficients and supplies the Gabor spectrum output.

Basically, the Gabor spectrum algorithm consists of the following steps 1-8.

Step 1

Select a window length L. In one implementation, the value L is always a power of two. For instance, L=64, 128, 256, 512, ..., etc. After L is determined, the frequency resolution is also determined by $$\Delta f = \frac{fs}{L}, \qquad (1)$$

where fs is the sampling frequency of the converter.

L = 128 or L=256 is suitable for a typical speech processing application.

Step 2

Select an oversampling rate. The oversampling rate is decided by $$\text{Oversampling rate} = \frac{L}{\Delta M \Delta N} \quad (2)$$

where
ΔM is the time-domain increment, and
ΔN is the frequency domain increment.

Figure 4:
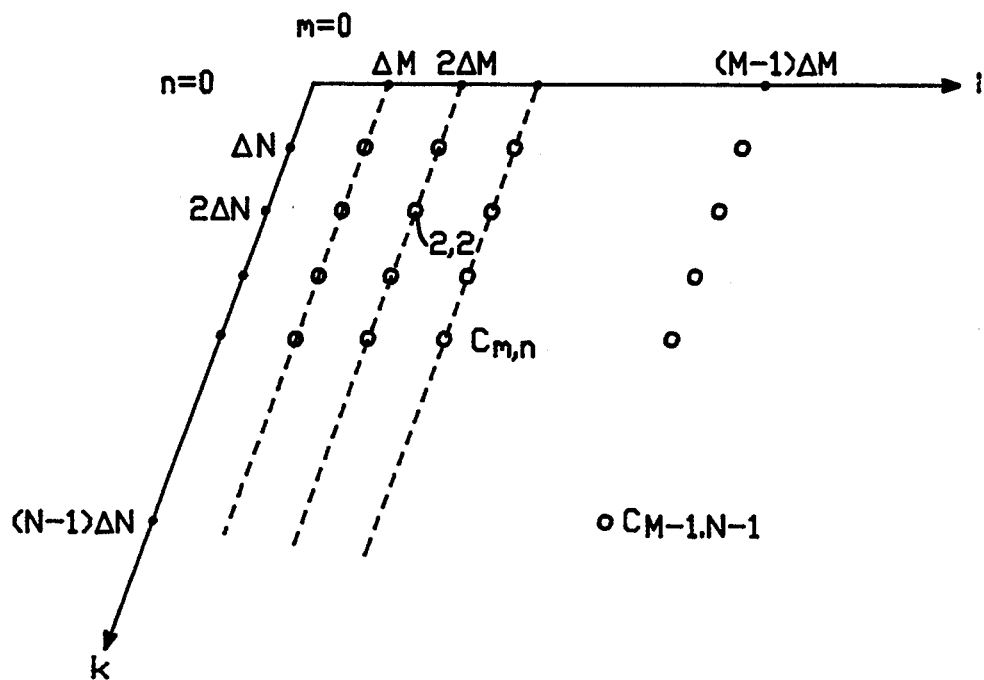
FIG. 4 is a heuristic diagram illustrating the sampling distribution used in the computation of the Gabor spectrum.

(mΔM, nΔN), where m goes 0 to (SL/ΔM-1), where SL is the sample length, and n goes from 0 to (L/ΔN-1), are the coordinates where a gaussian function is found in the Gabor transform. FIG. 4 illustrates the location of coefficients $C_{m,n}$ in a Gabor transform algorithm. The oversampling rate of 4 is preferred, though other values are possible. The bigger the oversampling rate, the more computation you must do. An oversampling rate of four has proven to be a good compromise between resolution of the output spectrum and the amount of computation required.

Step 3

Select ΔM and ΔN such that $$\Delta M \Delta N = \frac{L}{\text{Oversampling rate}} \quad (3)$$

In the implementation of Appendix A, when L=128, we chose ΔM=8 and ΔN=4 though other choices may be quite suitable as well. The selection of ΔM and ΔN determine the resolution of the Gabor spectrum in the time and frequency coordinates, respectively.

Step 4

Given L, ΔM, and ΔN, the variance value $\sigma^2$ for the window function can be determined by $$\sigma^2 = \frac{\Delta M}{\Delta N} \frac{L}{2\pi} \quad (4)$$

This ensures a localized gaussian function for the window function h. A larger variance can be used for better frequency domain resolution. A smaller variance can be used for better time domain resolution.

Step 5

Figure 9:
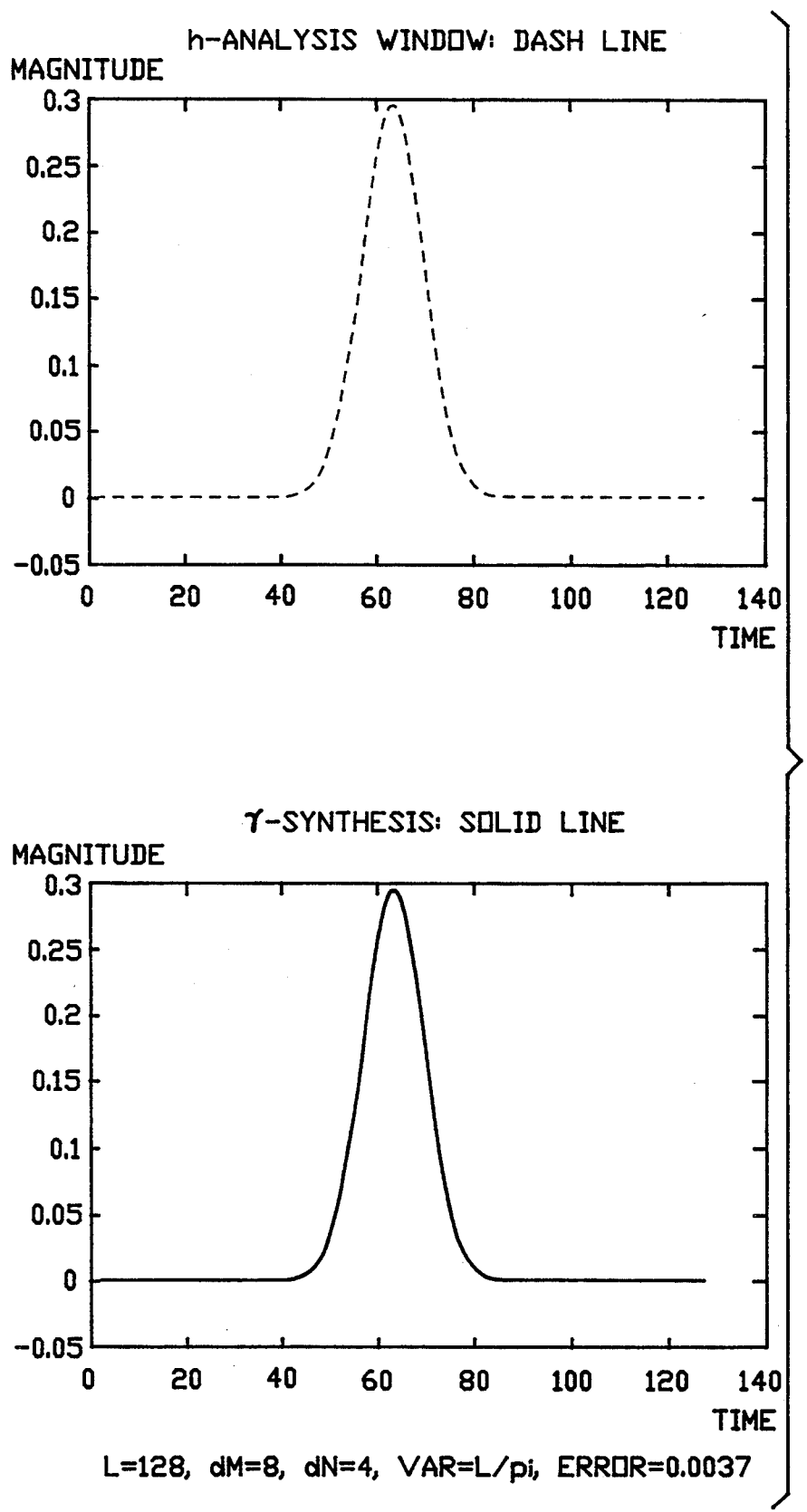
FIG. 9 is a graph of the localized window function h and the discrete auxiliary function $\gamma$ used in one application of the signal analyzer of the present invention.

Given L and $\sigma^2$, the gaussian window function h[L] is given, and the discrete auxiliary function γ[L] may be determined as shown in Appendix B, such that γ is similar to h in terms of least squares error. In a preferred system, γ and h are non-overlapping at the limits of the indexed region. Example auxiliary function γ[L] and window function h[L] are shown in FIG. 9.

Steps 1–5 are preliminary steps. The actual spectrum calculation is done from Step 6 on.

Step 6

Figure 3:
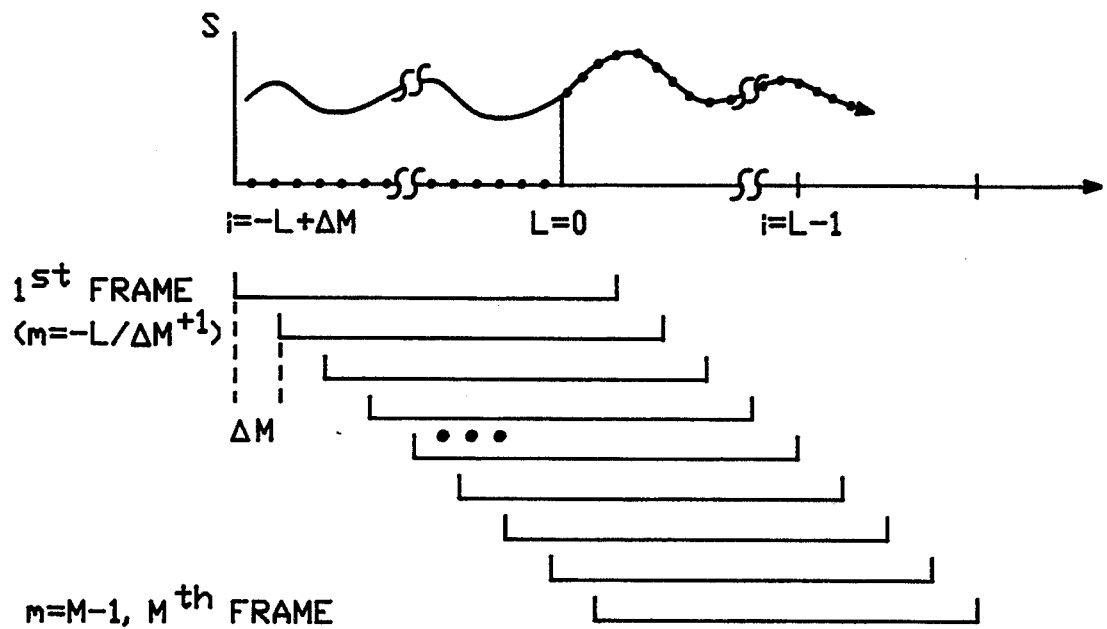
FIG. 3 illustrates the construction of frames of digital signals used in the computation of the Gabor spectrum.

FIG. 3 shows how a continuous signal is discretized and how the current algorithm is applied to a sequence of L point frames of the discrete signal s(i). Once the L-points of a frame are acquired, the magnitudes of Gabor coefficients for the L-points are computed by $$|C_{m,n}| = \left| \sum_{i=0}^{L-1} s(i + m\Delta M)\gamma^*(i) W_L^{-n\Delta Ni} \right| \quad (5)$$

where
* indicates complex conjugate
s(i)=0 for i<0
m=−L/ΔM+1, −L/ΔM+2, . . . , 0, 1, 2, . . .
n=0, 1, 2, . . . , N-1

$$N = \frac{L}{\Delta N}$$

$$W^{-n\Delta Ni} = e^{-2\pi n \Delta Ni/L} \quad (6)$$

The quantity of mΔM shows how the input data are used. The following examples illustrate this process.
m=−L/ΔM+1, s(−L+ΔM), s(−L+ΔM+1), . . . , s(ΔM-1) are used
m=0, s(0), s(1) . . . , s(L-1) are used;
m=1, s(ΔM), s(ΔM+2), . . . , s(ΔM+L-1) are used;
m=2, s(2ΔM), s(2ΔM+2), . . . , s(2ΔM+L-1) are used;
In general, s(mΔM), s(mΔM+1), . . . , s(mΔM+L-1) are used.

In each time, the coefficients $C_{m,n}$ are computed where n=0, 1, . . . , N-1.

As can be seen, this computation has the form of a sequence of FFT computations.

Step 7

After the coefficients $C_{m,n}$ are computed for s(i), the spectrum of the signal can be computed by using the cross-term deleted Wigner-Ville Distribution. Note that the Gabor coefficients $C_{m,n}$ are sparsely located, a complete reconstruction of the spectrum requires the interpolation of the points between the coefficients $C_{m,n}$. After deleting the cross-term interference in a Wigner-Ville Distribution, the signal energy can be computed by $$GS_s(i,k) = 4 \sum_{m=-L/\Delta M+1}^{\infty} \sum_{n=0}^{N/2-1} |C_{m,n}|^2 \exp\left\{ -\left[ \frac{(i - m\Delta M)^2}{\sigma^2} + \left(\frac{2\pi\sigma}{L}\right)^2 (k - n\Delta N)^2 \right] \right\} \quad (7)$$

$$0 \leq i < \infty, \quad 0 \leq k \leq L/2 - 1$$

Step 8

Figure 5:
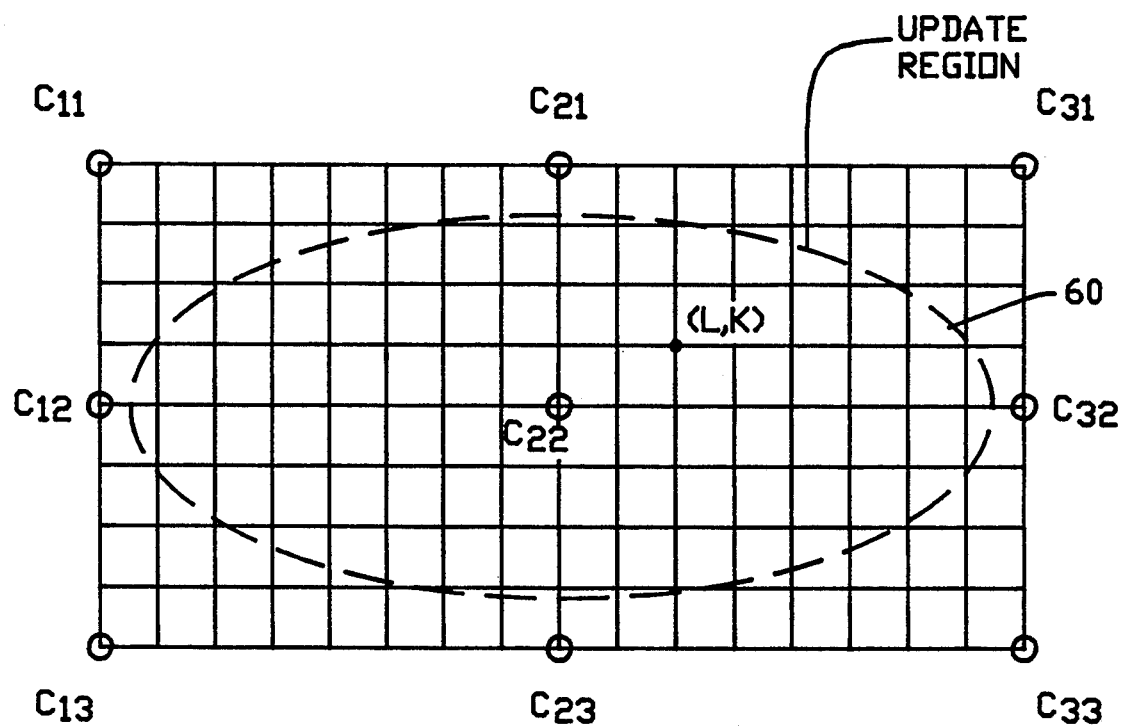
FIG. 5 is an example of an update region used for computation of the energy distribution for the Gabor spectrum according to the present invention.

For each Gabor coefficient $|C_{m,n}|$ at (mΔM, nΔN), the spectrum value $GS_s(i,k)$ is computed by the formula in Step 7 and accumulated with the previous value of $GS_s(i,k)$. That is, as shown in FIG. 5, the energy at point (i,k) is the accumulated contribution from the distributions of coefficients $C_{22}$, $C_{21}$, $C_{31}$, and $C_{32}$, and possibly others. Using the computer language expression, such accumulation can be expressed as $$GS_s(i,k) = GS_s(i,k) + \quad (8)$$

$$4|C_{m,n}|^2 \exp\left\{ -\left[ \frac{(i - m\Delta M)^2}{\sigma^2} + \left(\frac{2\pi\sigma}{L}\right)^2 (k - n\Delta N)^2 \right] \right\}$$

The constant "4" in equation (8) is a normalization factor that can vary according to a particular application. Because the term $$\exp\left\{-\left[\frac{(i-m\Delta M)^2}{\sigma^2}+\left(\frac{2\pi\sigma}{L}\right)^2(k-n\Delta N)^2\right]\right\} \quad (9)$$

decreases rapidly when the point (i,k) is away from the Gabor coefficient at (m$\Delta$M, n$\Delta$N), the iteration in this step may be limited to a very small region around the point (m$\Delta$M, n$\Delta$N). The exact size region can be adjusted for applications. Also, the above exponential term need not be computed every time. It can be precomputed and stored in a look-up table.

A key problem of computing the spectrum is to decide when to stop, or the size of the update region. Because the energy contributions of $C_{m,n}$ to its neighboring points exponentially decrease, there is no need to compute the points very far away from (m$\Delta$M, n$\Delta$N). Hence, we need to decide the update region for each Gabor coefficient $C_{m,n}$. The update region is defined as an elliptic within which the spectrum needs to be computed such as shown in FIG. 5.

Let i'=i-m$\Delta$M and k'=k-n$\Delta$N, Eq. (9) can be rewritten as:

$$\exp\left\{-\left[\frac{i'^2}{\sigma^2}+\left(\frac{2\pi\sigma}{L}\right)^2 k'^2\right]\right\} \quad (B.1)$$

which is a two dimensional elliptic such as trace 60 of FIG. 5. The update region for any coefficient is defined to be:

$$\frac{|C_{m,n}|^2}{|C_{m,n}|^2_{max}}\exp\left\{-\left[\frac{i'^2}{\sigma^2}+\left(\frac{2\pi\sigma}{L}\right)^2 k'^2\right]\right\}=10^{-dB/20}, \quad (B.2)$$

where $|C_{m,n}|_{max}$ is the maximum magnitude of all the Gabor coefficients.

Hence, the update region for each coefficient is:

$$|i'|=\sigma\sqrt{\frac{dB\ln(10)}{20}+\ln\frac{|C_{m,n}|^2}{|C_{m,n}|^2_{max}}} \quad (B.3)$$

$$|k'|=\frac{L}{2\pi\sigma}\sqrt{\frac{dB\ln(10)}{20}+\ln\frac{|C_{m,n}|^2}{|C_{m,n}|^2_{max}}-\frac{i'^2}{\sigma^2}} \quad (B.4)$$

The maximum update region is the one when $|C_{m,n}|^2=|C_{m,n}|^2_{max}$, which leads to:

$$|i'_{max}|=\sigma\sqrt{\frac{dB\ln(10)}{20}} \text{ and} \quad (B.5)$$

$$|k'_{max}|=\frac{L}{2\pi\sigma}\sqrt{\frac{dB\ln(10)}{20}} \text{ and} \quad (B.4)$$

Thus, $k'_{max}$ and $j'_{max}$ give the size of the look-up table. Only positive indices and their values need to be stored because Eq. (B.2) is an even function in terms of i' and k'.

Once the table is created, the computing of Eq. (8) is straightforward. Find the correspondent entry in the table and multiply the value by $|C_{m,n}|^2$. The evaluation of computationally expensive exponential function is thus avoided.

Figure 2A:
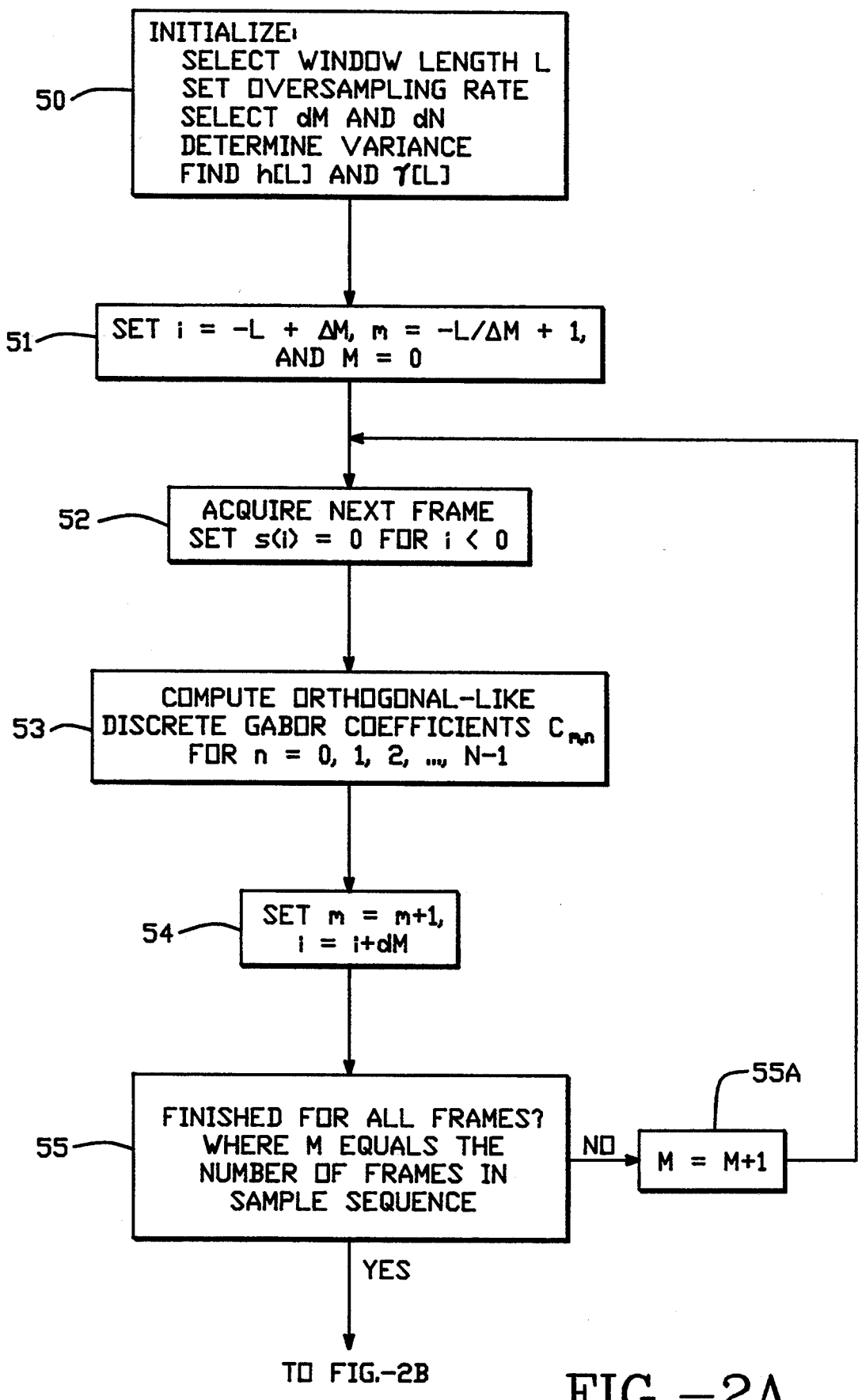
FIGS. 2A and 2B are a flow chart of the method for computing the Gabor spectrum according to the present invention.
Figure 2B:
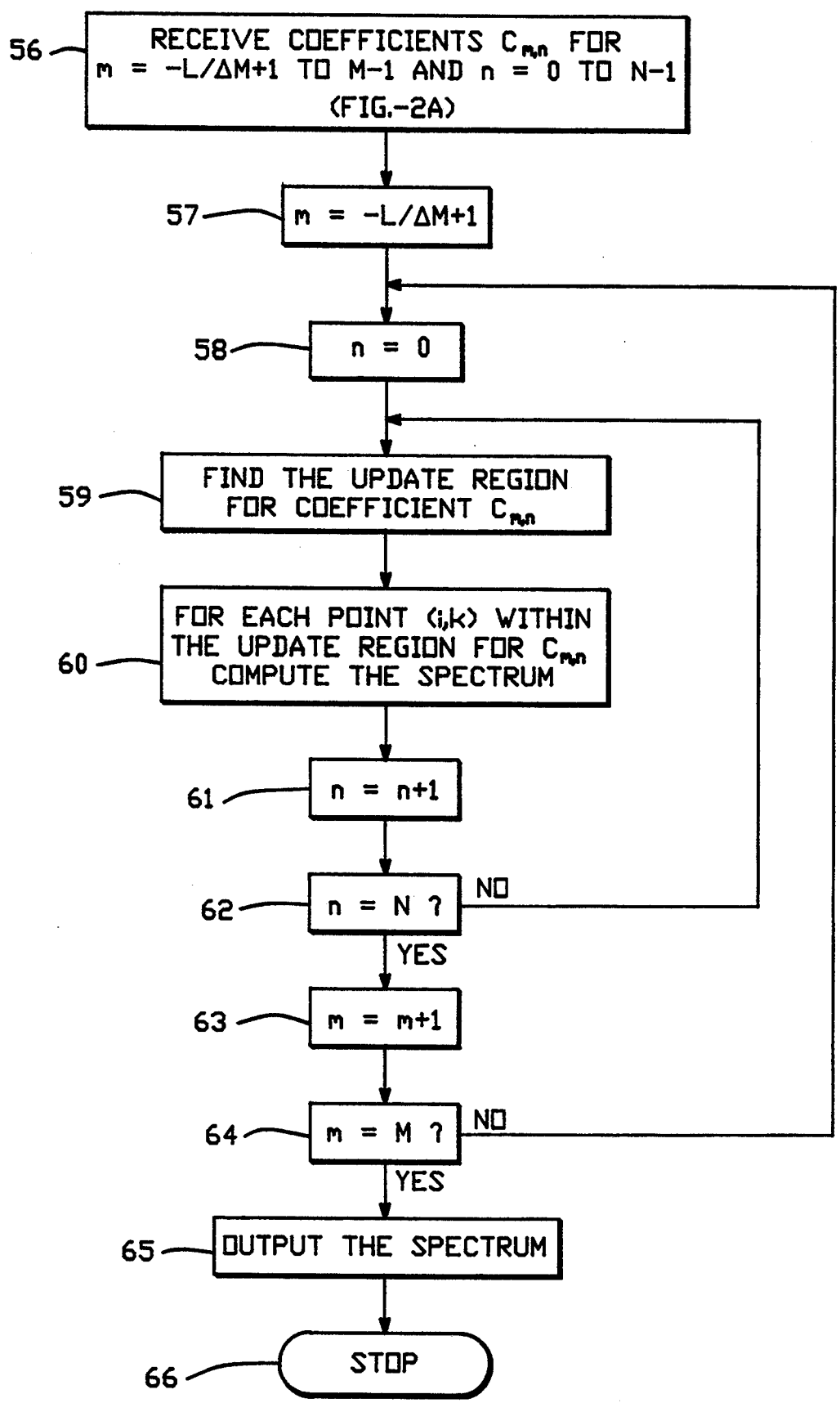

FIGS. 2A and 2B illustrate the basic techniques involving computing the Gabor spectrum according to a preferred embodiment.

The routine involves first initializing the processor (block 50). This initialization involves the performing of steps 1-5 outlined above.

Next, the Gabor coefficients are computed according to the algorithm embodied by blocks 51, 52, 53, 54, and 55 on FIG. 2A.

In particular, the index i is set to $-L+\Delta M$, the index m is set to L/$\Delta$M+1 and M is set to zero (block 51).

Next, the routine acquires the next L points, and sets the input function s(i) equal to zero for i less than zero (block 52).

The next step computes an L-point orthogonal-like discrete Gabor coefficient $C_{m,n}$, for the index n=0 through N-1. This computes a column of coefficients for m equal to a constant (block 53). In the next step, m is incremented, and the index i is set equal to i+$\Delta$M (block 54).

Next, the routine determines whether the coefficients have been calculated for all of the frames by testing the index of the loop M, where M equals the number of frames in the sample sequence processed by the loop (block 55). If the routine is not finished, then it branches to block 55A when M is incremented and then back to block 52. If the sequence is finished, then the algorithm proceeds to compute the energy distribution for each of the coefficients according to the routine shown in FIG. 2B.

To compute the spectrum, based on the energy distribution around each of the coefficients, the algorithm receives the coefficients generated by the routine shown in FIG. 2A (block 56). In the next step, the index m is set to $-L/\Delta M+1$ (block 57). Next, the index n is set to zero (block 58).

Next, the update region for the coefficient $C_{m,n}$ is found based on the magnitude of the coefficient (block 59).

For each point (i,k) within the update region for the coefficient, the energy distribution or spectrum is computed (block 60). Next, the index n is incremented (block 61). In the next step, the index n is tested against the value N to determine whether the distribution for all of the coefficients in the column has been computed. If n is not equal to N, then the algorithm loops back to block 59. If n is equal to N, then a column has been completed and the algorithm proceeds to block 63 where the index m is incremented. In the next step (block 64) the algorithm determines whether the index m has reached the maximum value M. If not, then the algorithm loops to block 58 to process the next frame of coefficients. If m is equal to M, then the algorithm is completed, and the energy distribution values are used to output the Gabor spectrum (block 65). Finally, the routine stops (block 66).

Figure 6:
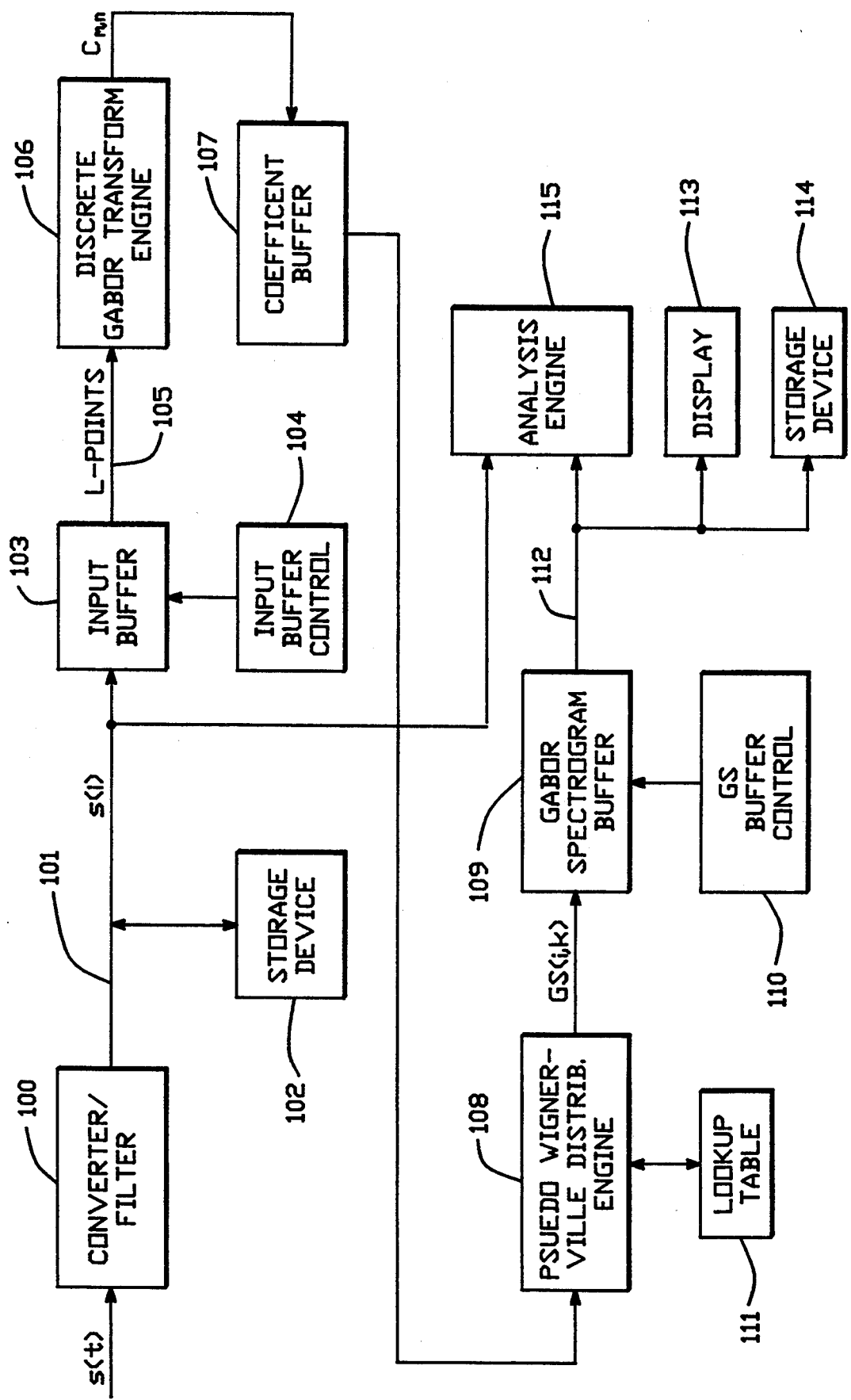
FIG. 6 is a more detailed block diagram of a signal analyzer for generation of the Gabor spectrum according to the present invention.

FIG. 6 illustrates a Gabor spectrogram analyzer according to the present invention. The Gabor spectrogram analyzer is an instrument used to analyze an input signal characterized by a time varying frequency spectrum. The apparatus shown in FIG. 6 is particularly useful for signals in the range from 0–20 kH, such as encountered in typical speech processing algorithms. However, the apparatus may be designed to operate in a variety of frequency ranges. Therefore, the same basic apparatus is applicable to a wide variety of input signals with varying frequency ranges.

The system includes a converter/filter 100, including an anti-aliasing filter and an A/D converter. The anti-aliasing filter is an integral part of a variety of data acquisition systems. The purpose of the anti-aliasing filter is to remove unwanted high frequency components so that there will be no aliasing problem when the continuous signal is digitized. According to the sampling theorem, if the highest frequency in an instrument frequency range is f, then the anti-aliasing filter must be designed in such a way that any frequency higher than f should be effectively removed. Because it is not possible to design a perfect low pass filter, the anti-aliasing filter is often designed in such a way that the cutoff frequency is slightly higher than f. The sampling frequency (the rate at which the continuous signal is digitized) must be at least twice that of the highest frequency. In the analyzer shown in FIG. 6, in which the highest frequency is 20 kH, the minimum sampling rate is 40 kH. To provide some safeguard, an audioboard sampling at 48 kH is used which guarantees no aliasing between 0 and 20 kH.

The output of the converter/filter 100 is supplied on line 101 as the signal s(i). A storage device 102 is used for storing the input sequence for later use. For signals that have already been acquired and stored, the converter/filter 100 may not be necessary in a given application. The storage device 102 may act as the source of the sequence of digital signals representing an analog input.

The discrete data on line 101 is supplied to an input buffer 103. The input buffer is controlled by input buffer control 104. The purpose of the buffer 103 is to accumulate enough points (L) for further processing. Each L point block of data is called a frame.

The input buffer control controls the input buffer. Its primary function is to maintain the input buffer 103 and provide overlapping data addressing and the like for ongoing processing of the routine. Depending on the selected time domain increment $\Delta M$, the input buffer control appends $\Delta M$ points to a current frame, and removes the first $\Delta M$ points to form a new frame.

An L point data frame is available at the output of the buffer 103 on line 105. The frame on line 105 is supplied to a discrete Gabor transform engine 106. The engine 106 performs the Gabor transform according to the algorithm shown in FIG. 2A. The engine 106 maps the one dimensional signal data s(i) to a set of Gabor coefficients in a two dimensional time-frequency domain over the index (i,k).

The output of the Gabor transform engine 106 is an array of coefficients $C_{m,n}$ for frame m over a sequence of frequency increments on index n. This array of coefficients may be supplied to a coefficient buffer 107, such as a register array or the like. From the coefficient buffer 107, the array of coefficients is supplied to a pseudo-Wigner-Ville distribution engine 108. The engine 108 performs the pseudo-Wigner-Ville distribution with deleted cross term interference according to the routine shown in FIG. 2B. The output is a spectrum defined by the Wigner distribution of energy around each of the coefficients $C_{m,n}$. A collection of spectra for the array of coefficients is the Gabor spectrogram GS(i,k). The spectrogram is supplied to a Gabor spectrogram buffer 109 under control of the Gabor spectrogram buffer control 110. The Gabor spectrogram buffer control maintains and controls the Gabor spectrogram buffer 109.

Coupled with the pseudo-Wigner-Ville distribution engine is a look-up table 111. The look-up table stores factors used in the distribution function, as discussed above. Using the look-up table, the computation of these factors can be performed offline, making the algorithm suitable for near real time computation of the Gabor spectrogram.

The Gabor spectrogram buffer control 110 appropriately disposes of the data in the buffer 109 once it is full. For instance, the data is supplied on line 112 to a display system 113 in which a graphic representation of the Gabor spectrogram is generated and displayed. Alternatively, the data on line 112 may be supplied to a storage device 114 for later processing.

In the embodiment shown in FIG. 6, the data on line 112 is supplied to an analysis engine 115. The input sequence s(i) on line 101 is also supplied as an input to the analysis engine. This analysis engine may partition the input signal s(i) in response to the Gabor spectrogram data on line 112 so that the partitioned sections of the input signal may be independently analyzed.

Applications of the displayed Gabor spectrogram, or the data generated by the spectrogram for analysis engine 115 include spectrum analyzers, speech recognition systems, speech analysis and synthesis systems, voice detection systems, underwater acoustics detectors, radar communications, mobile phone communications, and telephone tune detection systems.

FIGS. 7A and 7B illustrate input signals which are analyzed using a routine such as provided in Appendix A according to the present invention. In FIG. 7A, a frequency hopper signal is shown in which there are four discrete frequency components in discrete time windows. In FIG. 7B, a noisy hopper signal with a signal to noise ratio of 0 dB is shown.

FIG. 8A illustrates a Gabor spectrum for the frequency hopper signal of FIG. 7A, in which the contours represent increasing energy values at the time and frequency locations on the spectrum. Thus, if the graph shown in FIG. 8A were shown in three dimensions, each of the regions having contours would appear as peaks on the field of the paper.

It can be seen that each of the four frequency components of the hopper signal are localized in time in the Gabor spectrum. Because of this clear localization and separation between the components, the Gabor spectrum is particularly useful for analyzing signals which have frequency components which vary in time.

FIG. 8B illustrates the Gabor spectrum of the noisy hopper signal of FIG. 7B at the quadruple oversampling rate. As can be seen, even in a very noisy signal, the Gabor spectrum localizes the frequency components relatively well. It is believed that the Gabor spectrum is better than prior art techniques for generating time varying spectra of input signals.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

Appendices A and B.

APPENDIX A

Example Source Code Implementation copyright, National Instruments, 1992

```
/*************************************************************
    GaborSpectrum.c:   This program performans Gabor Spectrum.

LabVIEW 2.0     © National Instruments, Corp.

Inputs:
            ZHandle -   handle to the real samples
            yHandla -   handle to the synthesis window information
            a       -   dynamic range Outputs:
            PHandle -   handle to the Gabor spectrum
            error   -   binary error control
            message -   error message
**************************************************************/
#include    "JTFA.h"
define     GaborSpectrum   CINRun pascal void    GaborSpectrum(ZHandle,yHandle,alpha,PHandle,error,message)

F11DH       ZHandle, yHandle;
    float       *alpha;
    F12DH       PHandle;
    binary      *error;
    StrH        message;
    {
        float       a, var, *y, *z, max, *G, *P;
        long        df, dt, K, L, N, TL, size;
        register long  i, m;

ClearError(message, error);             /* clear error */

HLock(yHandle);                         /* lock down handles */

L = (*yHandle) -> dimSize;
        L = L - 3;
        K = L >> 1;

y = (*yHandle) -> data;

dt = *(y+L);
        df = *(y+L+1);
        var = *(y+L+2);

HLock(ZHandle);
        TL = (*ZHandle) -> dimSize;             /* Total Samples */
```

```
            N = TL - L;                                    /*  distinct time instance  */
            if (N < L) {
                ReportError("Total samples N must be at least greater than or equal "
                "to the block length L.", message, error);
        HUnlock(ZHandle);
        return;
        }
    z = (*ZHandle) -> data;

G = (float*) NewPtr(N/dt * K/df * sizeof(float));

/****************************************************
     *    Calculate magnitude of Gabor coefficients     *
     ****************************************************/
    GaborMagnitude(z,TL,L,dt,df,y,G,&max);

HUnlock(yHandle);
    HUnlock(ZHandle);

/****************************************************
     *    Allocate the output array with size z[N][K]   *
     ****************************************************/
    size = N * K * sizeof(float) + 8L;
    SetHandleSize(PHandle, size);
    (*PHandle) -> rows = N;
    (*PHandle) -> cols = K;
    HLock(PHandle);
    P = (*PHandle) -> data;

ClearArrayFloat(P, N*K);

a = *alpha;
    AutoWV(a,var,G,max,N,K,dt,df,P);

DisposPtr(G);
    HUnlock(PHandle);
    }

/*
        ClearArrayFloat will clear an float array.
        p:  starting address of the array
        count:  number of array elements The array is assumed to have float data type.
        count must be in the range of [1, 2**16-1]
    */
    ClearArrayFloat(p, count)
    float *p;   long count; {
        asm {
            movea.l  p, a0
            move.l   count, d0
            subq.l   #1, d0
            bmi.w    @outLoop1
        @Loop1:
            clr.l    (a0)+
            dbf      d0, @Loop1
        @outLoop1:
```

```
        }
    }

/*
    ClearArray will clear an extended array.
    p:  starting address of the array
    count:  number of array elements The array is assumed to have an extended data type.
    count must be in the range of [1, 2**16-1]
*/
ClearArray(p, count)
extended *p; long count; {
    asm {
        movea.l  p, a0
        move.l   count, d0
        subq.l   #1, d0
        bmi.w    @outLoop1
    @Loop1:
        clr.l    (a0)+
        clr.l    (a0)+
        clr.l    (a0)+
        dbf      d0, @Loop1
    @outLoop1:
    }
}
```

```
/****************************************************************
*   GaborMagnitude.c:                                            *
*        This program evaluates magnitude of Gabor coefficients for a *
*        given complex sequence Z.                               *
*                                                                *
*   LabVIEW 2.0      © National Instruments, Corp.               *
*                                                                *
*                                                                *
*                                                                *
*   Inputs:                                                      *
*        zr[]    -   real parts of input                         *
*        TL      -   total data                                  *
*        L       -   window size                                 *
*        dt      -   time sampling step                          *
*        df      -   frequency sampling step                     *
*        gamma   -   synthesis window function                   *
*                                                                *
*   Outputs:                                                     *
*        G[]     -   magnitude of Gabor coefficients             *
*        max     -   maximum of G[]                              *
****************************************************************/
include <JTFAExt.h> void    GaborMagnitude(zr,TL,L,dt,df,gamma,G,max)
    float       *gamma, zr[], G[], *max;
    long        TL, L, dt, df; { extended    *z0, *z1;
    float       *g, *z, *Zr;
    long        m, M, locN, N, N2;
    register    long    i, n;
```

```
    *max = 0.0;
    N = L / df;                         /* number of samples in frequency */
    N2 = N >> 1;
    logN = Log2(N);
    M = (TL-L) / dt;                    /* number of samples in time */ z0 = (extended*) NewPtr(N * sizeof(extended));
    Zr = (float*) NewPtr(N * sizeof(float));

for (m = 0 ; m < M ; m++, zr+=dt)   { g = gamma;
        z = zr;
        ClearArrayFloat(Zr, N);

/***********************************************
*    Magnitude of Gabor coefficients at m      *
***********************************************/
        for (i = 0 ; i < df ; i++)   {

MulArray(z, g, N, z0);
            z += N;
            g += N;

ReFFT(z0, N, logN);

z1 = z0;
            for (n = 0 ; n < N ; n++)
                Zr[n] += *z1++;
        }

*G = Zr[0] * Zr[0];
        if (*G > *max)
            *max = *G;
        G += 1;

for (n = 1 ; n < N2 ; n++ , G++)    {
            *G = Zr[n] * Zr[n] + Zr[N-n] * Zr[N-n];
            if (*G > *max)
                *max = *G;
        }
    }
    DisposPtr(z0);
    DisposPtr(Zr);
}

/*
    MulArray(x, y, n, z)
    z[i] = x[i] * y[i]
    x, y are float and z is exteded
    n must be in the range [1, 2**16-1]
*/

MulArray(x, y, n, z)
extended *z;    float *x, *y;   long n; {
  asm {
    move.l  a2, -(sp)
```

```
        movea.l  x, a0
        movea.l  y, a1
        movea.l  z, a2
        move.l   n, d0
        subq.l   #1, d0
        bmi.w    @outLoop1
    @Loop1:
        fmove.s  (a0), fp1        ;fp1=x[i]
        fmul.s   (a1), fp1        ;y[i]*x[i]
        fmove.x  fp1, (a2)        ;save z[i]
        add.l    #4, a0           ;x++
        add.l    #4, a1           ;y++
        add.l    #12, a2
        dbf      d0, @Loop1
    @outLoop1:
        move.l   (sp)+, a2
    }
}
```

```
/*********************************************************************
    AutoWV.c:   This program evaluates the Auto-Wigner distribution.

LabVIEW 2.0    ©   National Inatruments, Corp.

Inputs:
            a    -  dynamic range
            var  -  variance of window function
            G[]  -  magnitude of Gabor coefficients
            max  -  maximum of G[]
            TL   -  total length of data
            K    -  half length of window
            dt   -  time sampling step
            df   -  frequency sampling step
    Output:
            P[][]  -  Auto-Winger distribution
*********************************************************************/
include <JTFAExt.h> void    AutoWV(a,var,G,max,TL,K,dt,df,P)
    float       a, var, G[], max, P[];
    long        TL, K, dt, df;  { float       A, b, c, N2, r, r0, s, s0, *p, *t, *T;
        long        dm0, dm, dn0, dn, N, N1, sizeF, sizeF0, sizeT, sizeT0;
        register    long    i, j;

b = (float) (K << 1) / (dt * df);      /* oversampling  */
        b *= b;
        b = 2. / b;
        N = (K << 1) / df;                     /* # of samples in frequency */
        N2 = (float) (N * N);
        a *= 2.302585;
        s = sqrt(var);                         /* stand diviation */

/***************
```

```
 *    table E   .    *
 ****************/
sizeT0 = (long) (s * sqrt(a) + 1);
s0 = Pi * s;
c = s0 / K;
sizeF0 = (long) (sqrt(a) / c + 1);
c *= c;                              /*  c = (2*pi*var / L) ^ 2   */
T = (float*) NewPtr(sizeT0 * sizeF0 * sizeof(float));
t = T;

for (i = 0 ; i < sizeT0 ; i++)  {
    r = i * i / var;
    for (j = 0 ; j < sizeF0 ; j++)
        *t++ = b * exp(-(r + j * j * c));
}

/************************
 *   Look up the table    *
 ***********************/
for (dm0 = 0 ; dm0 < TL ; dm0+=dt)  { for (dn0 = 0 ; dn0 < K; dn0+=df)    {
        A = *G++;
        r = log(A / max);
        r += a;

if (r <= 0)
            sizeT = 0;
        else
            sizeT = (long) (s * sqrt(r));

for (i = -sizeT ; i <= sizeT ; i++) { r0 = i * i / var;
            if (r <= r0)
                sizeF = 0;
            else
                sizeF = (long) (sqrt(r - r0) * K / s0);

dm = dm0 + i - 1;
            if (dm >= 0 && dm < TL) {
                p = P + dm * K + dn0 - 1 - sizeF;
                t = T + labs(i) * sizeF0;
                for (j = -sizeF ; j <= sizeF ; j++, p++)    {
                    dn = dn0 + j - 1;
                    if (dn >= 0 && dn < K)
                        *p += A * *(t + labs(j));
                }
            }
        }
    }
}
DisposPtr(T);
}
```

APPENDIX B

Computing the Auxiliary Function $\gamma$

Assuming the H has full row rank p, we can use the QR decomposition to obtain $$H^T_{L \times p} = Q_{L \times L} \left| \begin{array}{c} R_{p \times p} \\ \hline O_{(L-p) \times p} \end{array} \right|, \qquad (A.1)$$

where Q is orthonormal and R is upper triangular. Because the first row of H is $h^T$ where $h^T = [h(0), h(1), ..., h(L-1)]$, Eq. (A.1) leads to $$|h, ....| = |r_{1,1} q_1, r_{1,2} q_1 + r_{2,2} q_2, ....|.$$

Hence $$h = r_{1,1} q_1. \qquad (A.2)$$

where $q_1$ is the first column of Q. Substituting Eq. (A.1) into $$H\gamma = \mu \qquad (A.3)$$

We get $$| R^T | O | Q^T \gamma = | R^T | O | \left| \begin{array}{c} x_{p \times 1} \\ \hline y_{(L-p) \times 1} \end{array} \right| = \mu_{p \times 1} \qquad (A.4)$$

In (A.4), x is determined from $$x = (R^T)^{-1} \mu, \qquad (A.5)$$

and the vector y is arbitrary. Since $Q^T Q = I$, we have $$\gamma = Q \left| \begin{array}{c} x_{p \times 1} \\ \hline y_{(L-p) \times 1} \end{array} \right| = Q_x | Q_y \left| \begin{array}{c} x_{p \times 1} \\ \hline y_{(L-p) \times 1} \end{array} \right| = Q_x x + Q_y y, \qquad (A.6)$$

$x \in R^p$, and $y \in R^{L-p}$.

$Q_x = [q_1, ..., q_p]$ and $Q_x = [q_{p+1}, ..., q_L]$

Several remarks are now in order.

(a) Because $h = r_{1,1} q_1$, the window function h(i) is in the range of the matrix $Q_x$. Therefore, we have $$Q_y^T h = O. \qquad (A.7)$$

(b) The biorthogonal auxiliary window function $\gamma$ is the sum of two orthogonal vectors, $Q_x x + Q_y y$. Thus $$\|\gamma\|^2 = \|x\|^2 + \|y\|^2 \qquad (A.8)$$

(c) While $Q_x x = Q_x (R^T)^{-1} \mu$ is determined by the biorthogonality relation, $Q_y y$ depends on the particular constraints. When $Q_y y = 0$, the solution is $\gamma = Q_x x = \gamma_{min}$, which has a minimum energy.

$$\Gamma = \min_{\gamma:\, H\gamma=\mu} \left\| \frac{\gamma(i)}{\|\gamma(i)\|} - h(i) \right\|^2 = \min_{\gamma:\, H\gamma=\mu} = 2\left(1 - \frac{Re(\gamma^T h)}{\|\gamma\|}\right) \quad (A.9)$$

Minimizing $\Gamma$ w.r.t $\gamma$ is equivalent to $$\max_{\gamma:H\gamma=\mu} \xi = \max_{\gamma:H\gamma=\mu} \frac{Re(\gamma^T h)}{\|\gamma\|} \quad (A.10)$$

Because of the relationship $$\gamma^T h = x^T Q_x^T h + y^T Q_y^T h = (Q_x x)^T h \quad (A.11)$$

and (A.8), Eq. (A.10) can be written as $$\max_{y \in R^{L-P}} \xi = \max_{y:H\gamma=\mu} \frac{Re(x^T Q_x^T h)}{\sqrt{\|x\|^2 + \|y\|^2}} \quad (A.12)$$

Obviously, the maximum of $\xi$ occurs when $\|y\|$ is a zero vector. Substituting $y=0$ in Eq. (A.6) yields $$\gamma = Q_x x = Q_x (R^T)^{-1} \mu. \quad (A.13)$$

The corresponding least-square error is $$\Gamma = 2\left(1 - \frac{Re(\mu^T R^{-1} Q_x^T h)}{\|(R^T)^{-1}\mu\|}\right) \quad (A.14)$$

Eq. (A.13) is the solution to compute the optimal $\gamma$ that is most similar to $h$. The solution requires $\|y\|=0$, and Eq. (A.8) indicates that $\gamma$ contains the minimum energy. Thus $\gamma$ satisfies the minimum energy condition $$\gamma = H^T(HH^T)^{-1}\mu. \quad (A.15)$$

Indeed, one can easily prove that when $H^T=Q.R$ as given in (A.1), the minimum energy solution (A.15) is identical to the optimal solution (A.13).

What is claimed is:

1. A signal analyzer, comprising:
a source of a sequence of digital signals representative of an input signal; and
a processor coupled to the source for computing orthogonal-like discrete Gabor transform coefficients $C_{m,n}$ in response to the sequence, wherein the processor uses the coefficients to compute a time-varying spectrum of input signal energy;
wherein said spectrum is used in analyzing said input signal.

2. The signal analyzer of claim 1, wherein the first processor comprises a first means for generating the coefficients and a second means for computing the spectrum.

3. The signal analyzer of claim 2, wherein the second means includes storage means for storing a table of factors used in computation of the spectrum.

4. The signal analyzer of claim 1, wherein the processor computes a cross-term deleted Wigner-Ville distribution.

5. The signal analyzer of claim 1, wherein the processor includes a computation engine for computing an orthogonal-like discrete Gabor transform resulting in coefficients $C_{m,n}$ based upon a non-periodic, localized discrete window function h, and a discrete auxiliary function $\gamma$ similar to h, and wherein the processor further includes a computation engine for computing an energy distribution function for each of the coefficients $C_{m,n}$, the energy distribution function including a first factor based upon the magnitude of the Gabor coefficient, and a second factor varying according to the localized discrete window function of the Gabor transform.

6. The signal analyzer of claim 5, wherein the processor includes storage means for storing a precomputed table of values used for the second factors of the energy distribution function for a particular coefficient $C_{m,n}$ accessible in response to coordinates i,k of factors of the localized discrete window function near coordinates m,n of the particular coefficient.

7. The signal analyzer of claim 5, wherein the processor determines an update region for each coefficient $C_{m,n}$ in response to the first factor, and the distribution for each coefficient is computed within the determined update region.

8. The signal analyzer of claim 1, further including an input buffer memory system connected to receive the sequence supplied by the source and supply the sequence to the processor in a set of overlapping frames.

9. A signal analyzer, comprising:
 a source of a sequence of digital signals representative of an input signal;
 a first processor, coupled to the source, for computing orthogonal-like discrete Gabor transform coefficients $C_{m,n}$ in response to the sequence, and a time-varying spectrum of input signal energy in response to the coefficients; and
 a second processor, coupled to the first processor, which processes the spectrum.

10. The signal analyzer of claim 9, wherein the second processor includes:
 means, responsive to the spectrum, for partitioning the input signal.

11. The signal analyzer of claim 9, wherein the second processor includes:
 means, responsive to the spectrum, for displaying a graphic representation of the spectrum for use in analysis of the input signal.

12. The signal analyzer of claim 9, wherein the first processor comprises a first means for generating the coefficients and a second means for computing the spectrum.

13. The signal analyzer of claim 12, wherein the second means includes storage means for storing a table of factors used in computation of the spectrum.

14. The signal analyzer of claim 12, wherein the second means comprises a computation engine for computing a cross-term deleted Wigner-Ville distribution.

15. The signal analyzer of claim 12, wherein the first means includes a computation engine for computing an orthogonal-like discrete Gabor transform resulting in coefficients $C_{m,n}$ based upon a non-periodic, localized discrete window function h, and a discrete auxiliary function $\gamma$ similar to h, and wherein the second means includes a computation engine for computing an energy distribution function for each of the coefficients $C_{m,n}$, the energy distribution function including a first factor based upon the magnitude of the Gabor coefficient, and a second factor varying according to the localized discrete window function of the Gabor transform.

16. The signal analyzer of claim 15, wherein the second means includes storage means for storing a precomputed table of values used for the second factor of the energy distribution function for a particular coefficient $C_{m,n}$ computed by the first means, accessible in response to coordinates i,k of factors of the localized discrete window function near coordinates m,n of the particular coefficient.

17. The signal analyzer of claim 15, wherein the second means includes means for determining an update region for each coefficient $C_{m,n}$ in response to the first factor, and the distribution for each coefficient is computed within the determined update region.

18. The signal analyzer of claim 9, further including an input buffer memory system connected to receive the sequence supplied by the source and supply the sequence to the first processor in a set of overlapping frames.

19. The signal analyzer of claim 9, further including an output buffer memory system connected to receive the time-varying spectrum from the first processor and supply the time-varying spectrum to the second processor.

20. The signal analyzer of claim 9, wherein the source comprises an analog to digital converter.

21. The signal analyzer of claim 20, wherein the source includes an anti-aliasing filter.

22. A method for computing a time-varying spectrum of an input signal, comprising:
 acquiring a sequence of digital signals representative of the input signal;
 sampling the sequence of digital signals to define a plurality of windows of length L, each window in the plurality including a plurality of digital signals and each window shifted by length $\Delta M$ digital signals relative to an adjacent window;
 computing orthogonal-like discrete Gabor transform coefficients $C_{m,n}$ in sampling intervals $\Delta N$ and $\Delta M$, for n=0 through N-1 for each window m, and for the plurality of windows m=0 through M-1, such that $\Delta N$ $\Delta M$ is less than L;
 computing the time-varying spectrum of energy of the input signal in response to the coefficients $C_{m,n}$, and
 analyzing the input signal in response to the time-varying spectrum.

23. The method of claim 22, wherein the step of computing a spectrum includes computing a cross-term deleted Wigner-Ville Distribution.

24. The method of claim 22, wherein the step of computing orthogonal-like discrete Gabor transform coefficients $C_{m,n}$ includes performing a discrete Gabor transform with a non-periodic, localized discrete window function h, and a discrete auxiliary function $\gamma$ similar to h.

25. The method of claim 24, wherein h and $\gamma$ are non-overlapping.

26. The method of claim 24, wherein h is a gaussian function.

27. The method of claim 26, wherein the gaussian function h has a variance $\sigma^2$ less than or equal to about $0.5(L/12)^2$, wherein L is a window length of window m.

28. The method of claim 24, wherein $\gamma$ is similar to h in the sense of least squares error.

29. The method of claim 22, wherein the step of computing the time-varying spectrum includes providing a lookup table having an entry for each point i,k in the spectrum within a region around points $m\Delta M, n\Delta N$, the entries storing precomputed values for use in calculating the time-varying spectrum; and computing the time-varying spectrum using the values in the lookup table.

30. The method of claim 22, wherein the step of computing the time-varying spectrum includes:

for each coefficient $C_{m,n}$, determining an update region around the coefficient in response to the magnitude of the coefficient; and computing the time-varying spectrum within the respective update regions for each coefficient.

31. The method of claim 22, wherein the step of computing the time-varying spectrum includes for each coefficient $C_{m,n}$, determining an update region around the coefficient in response to the magnitude of the coefficient; and providing a lookup table having an entry for each point i,k in the time-varying spectrum within a region around points m$\Delta$M,n$\Delta$N, the entries storing precomputed values for use in a cross terms deleted Wigner-Ville distribution, wherein the lookup table includes enough factors to compute the cross terms deleted Wigner-Ville distribution for the coefficient having the largest update region; and computing the time-varying spectrum using the values in the lookup table.

32. The method of claim 22, wherein the step of analyzing includes generating a graphic representation of the spectrum.

33. The method of claim 22, wherein the step of analyzing includes partitioning the sequence of digital signals in time in response to the spectrum.

34. The method of claim 22, wherein the input signal comprises acoustic energy.

35. The method of claim 22, wherein the input signal comprises electromagnetic energy.

36. The method of claim 22, wherein the input signal comprises speech.

37. The method of claim 22, wherein the input signal comprises radar signals.

38. The method of claim 22, wherein the input signal comprises sonar signals.

39. The method of claim 22, wherein the step of acquiring includes filtering the input signal.

40. A signal analyzer, comprising:

a converter, having an input, which generates a sequence of digital signals representative of an input signal supplied to the input;

input memory means, connected to receive the sequence generated by the converter, for supplying the sequence in a set of overlapping frames;

first means, coupled to the input memory means, for computing orthogonal-like discrete Gabor transform coefficients $C_{m,n}$ in response to the set of overlapping frames, by performing a discrete Gabor transform with a localized, gaussian discrete window function h, and a discrete auxiliary function $\gamma$ similar to h;

second means, coupled with the first means, for generating a time-varying spectrum of input signal energy in response to the coefficients by computing a cross-terms deleted Wigner-Ville distribution; and analysis means, coupled to the second means, for processing the spectrum.

41. The signal analyzer of claim 40, wherein h is a gaussian function having a variance $\sigma^2$ less than or equal to about $0.5(L/12)^2$, wherein L is a window length of window m.

42. The signal analyzer of claim 40, wherein a contribution to the distribution of a particular Gabor transform coefficient computed by the first means is computed as a function of a first factor based upon the magnitude of the particular Gabor transform coefficient, and a second factor varying according to the localized window function of the Gabor transform, and the second means includes storage means for storing a precomputed table of values used for the second factor, accessible in response to coordinates i,k of factors of the localized window function near coordinates m,n of the particular Gabor transform coefficient.

43. The signal analyzer of claim 42, wherein the second means includes means for determining an update region for each coefficient $C_{m,n}$ in response to the first factor, and the distribution for each coefficient is computed only within the determined update region.

44. The signal analyzer of claim 40, further including an output buffer memory system connected to receive the distribution data from the first processor and supply the distribution data to the second processor.

45. The signal analyzer of claim 40, wherein the converter includes an anti-aliasing filter.

46. A signal analyzer, comprising:

a source of a sequence of digital signals representative of an input signal;

a first processor, coupled to the source, wherein said first processor comprises:

a first means including a computation engine for computing an orthogonal-like discrete Gabor transform resulting in coefficients $C_{m,n}$ based upon a non-periodic, localized discrete window function h, and a discrete auxiliary function $\gamma$ similar to h; and a second means comprising:

a computation engine for computing an energy distribution function for each of the coefficients $C_{m,n}$, the energy distribution function including a first factor based upon the magnitude of the Gabor coefficient, and a second factor varying according to the localized discrete window function of the Gabor transform; and storage means for storing a precomputed table of values used for the second factor of the energy distribution function for a particular coefficient $C_{m,n}$ computed by the first means, accessible in response to coordinates i, k of factors of the localized discrete window function near coordinates m, n of the particular coefficient; and a second processor, coupled to the first processor, which processes the energy distribution function.

47. A signal analyzer, comprising:

a source of a sequence of digital signals representative of an input signal;

a first processor, coupled to the source, wherein said first processor comprises:

a first means including a computation engine for computing an orthogonal-like discrete Gabor transform resulting in coefficients $C_{m,n}$ based upon a non-periodic, localized discrete window function h, and a discrete auxiliary function $\gamma$ similar to h; and a second means comprising:

a computation engine for computing an energy distribution function for each of the coefficients $C_{m,n}$, the energy distribution function including a first factor based upon the magnitude of the Gabor coefficient, and a second factor varying according to the localized discrete window function of the Gabor transform; and means for determining an update region for each coefficient $C_{m,n}$ in response to the first factor, wherein the distribution for each coefficient is computed within the determined update region; and a second processor, coupled to the first processor, which processes the energy distribution function.

48. A signal analyzer, comprising:

a source of a sequence of digital signals representative of an input signal;

an input buffer system connected to receive the sequence supplied by the source;

a first processor, coupled to the input buffer which receives the sequence from the input buffer, wherein the input buffer supplies the sequence to the first processor in a set of overlapping frames, wherein the first processor computes orthogonal-like discrete Gabor transform coefficients $C_{m,n}$ in response to the sequence, and a time-varying spectrum of input signal energy in response to the coefficients; and a second processor, coupled to the first processor, which processes the spectrum.

* * * * *